United States Patent [19]

Schmitt

[11] Patent Number: 4,739,197
[45] Date of Patent: Apr. 19, 1988

[54] PROCESS AND ARRANGEMENT FOR REGULATING THE KEYING RATIO OF AT LEAST ONE ELECTRICAL SIGNAL

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 849,009

[22] Filed: Apr. 7, 1986

[30] Foreign Application Priority Data

Apr. 19, 1985 [DE] Fed. Rep. of Germany ....... 3514155

[51] Int. Cl.⁴ .......................... H03K 5/13; H03K 5/22
[52] U.S. Cl. .................................... 307/511; 307/529; 328/155; 328/162
[58] Field of Search ............... 307/491, 511, 517, 522, 307/523, 529, 234, 362, 262, 271; 328/134, 162, 155, 140

[56] References Cited

U.S. PATENT DOCUMENTS

| | | | |
|---|---|---|---|
| 4,388,596 | 6/1983 | Yamashita | 328/134 |
| 4,463,272 | 7/1984 | Tucker | 307/517 |
| 4,599,570 | 7/1986 | Cloke | 307/511 |
| 4,641,087 | 2/1987 | Coffield | 328/134 |

FOREIGN PATENT DOCUMENTS 1945206  9/1969 Fed. Rep. of Germany .
2061588 12/1970 Fed. Rep. of Germany .
2459749 12/1974 Fed. Rep. of Germany .
2729697  7/1977 Fed. Rep. of Germany .
3046797 12/1980 Fed. Rep. of Germany .

Primary Examiner—Stanley D. Miller
Assistant Examiner—Timothy P. Callahan
Attorney, Agent, or Firm—Willian Brinks Olds Hofer Gilson & Lione Ltd.

[57] ABSTRACT

A process and apparatus for use in digital length or angle measuring systems for regulating the keying ratio of at least one periodic electrical signal. A signal is produced, proportional to the desired keying ratio, and compared with the periodic electrical signal. A momentary difference signal is generated from the comparison. If the frequency of the periodic electrical signal is within a selectable frequency range, the momentary difference signal is applied to a correction circuit, which is circuited parallel to a storage unit. The correction circuit supplies a correction signal, based on the momentary difference signal, to a sum amplifier. The sum amplifier is operative to superpose the correction signal on the periodic electrical signal, thereby regulating the keying ratio of the periodic electrical signal. The storage unit is operative to store a signal proportional to the difference signal. If the frequency of the periodic electrical signal is outside the selectable frequency, the correction signal is derived from the contents of the storage unit.

9 Claims, 3 Drawing Sheets

PROCESS AND ARRANGEMENT FOR REGULATING THE KEYING RATIO OF AT LEAST ONE ELECTRICAL SIGNAL

BACKGROUND OF THE INVENTION

The present invention relates to a process and apparatus, used in incremental measuring systems, for the regulation of the keying ratio of an electrical signal.

As is well known, incremental measuring systems produce impulses. The number of the impulses represents a measure of the linear displacement or the angle of rotation of a first object with respect to a second object. The incremental measuring systems often comprise photo-electric components. Such photo-electric digital length or angle measuring systems are used, for example, in processing machines for the measurement of the relative position of machine parts which are moveable with respect to one another. The measuring systems are also used in machines for processing a work piece or in measuring machines for the determination of the position or of the dimensions of a test object.

The resolution of such measuring systems is limited by the grid constant of the precision scales used in the instrument. However, the resolution of the measurement can be improved by interpolation techniques. The accuracy of the interpolation is dependent on the quality of the signal parameters. Faulty signal parameters in the form of amplitude fluctuations, superposed direct voltage components, phase errors and inadmissible harmonic components can severely limit the accuracy of the interpolation. Length and angle measuring systems are known which comprise an arrangement for eliminating such faulty signal parameters.

German unexamined patent specification OS No. 27 29 697 describes a measuring system with an arrangement for correcting the faulty signal parameters of the scanning signals. The deviations of the signal parameters are determined and stored in a memory as digital correction values. The digital correction values are then used by a computer prior to the interpolation to correct the digitized scanning signals. This process requires a storage unit and relatively extensive computing operations.

German patent No. 19 45 206 discloses an arrangement for the interpolation of path or angle dependent electrical signals in which the electrical signals are connected to a series of comparators with different trigger levels. These different trigger levels are adapted to the prescribed forms and amplitudes of the electrical signals. A reference signal, dependent on the amplitude of the electrical signal, is generated which adapts the trigger levels in response to the prescribed interpolation steps, or maintains the amplitude of the electrical signal constant by variable amplification in dependence on the reference signal. In this arrangement, continuously operative at all frequencies of the electrical signal, a correction signal is formed and superposed on the electrical signal or the control input of the comparators.

German unexamined patent specification OS No. 30 46 797 describes an error correction which is produced from a direct current level displacement of the electrical sinusoidal signal of a photo-electric measuring system. A mean value is generated from the maximum and minimum values of the electrical signal. The mean value is then compared in each case with a reference value for the generation of an error signal. The electrical signal is corrected by superposing the error signal with the electrical signal. The correction is dependent upon a further electrical signal which is phase shifted through 90°.

German patent No. 24 59 749 describes a pick-up monitoring arrangement for measuring the rate of rotation. The movement dependent electrical signal is converted by means of an integrator into a signal proportional to the keying ratio. The signal is then compared with an upper and lower reference limit. If the signal rises or falls above or below the respective reference limit, an alarm signal is triggered.

German published application AS No. 20 61 588 discloses a circuit for the regulation of a keying ratio of impulse sequences. A low pass component feeds only correction signals below a given frequency to an amplifier and is positioned in the feedback circuit of a closed regulating circuit.

These known processes and systems have the common disadvantage that, after the measuring system recovers from an operating pause, no error signal is present for the regulation of the faulty electrical signal. This disadvantage arises because the electrical components in a regulating circuit can only deliver the correction signal required for the regulation when the electrical components are in the operative state. A further disadvantage is that these known processes and arrangements produce an error signal at all frequencies of the periodic electrical signal. At low frequencies of the periodic electrical signal, the error signal is not operative to sufficiently correct for the influences of temperature, aging or drift. The inoperability arises because the electronic components used in the regulation circuit are only dependably operative within an admissible frequency range.

SUMMARY OF THE INVENTION

The present invention relates to a process and apparatus used in length or angle measuring systems for the regulation of the keying ratio of at least one periodic electrical signal wherein a correction signal is formed in dependence upon the difference between the actual keying ratio and the desired keying ratio.

According to this invention, at least one signal proportional to the keying ratio of the periodic electrical signal is compared with a desired value signal proportional to the desired value of the keying ratio. A momentary difference signal is produced. The momentary difference signal is applied to a correction signal only when the frequency of the at least one periodic electrical signal is within a selectable frequency range.

It is an object of the present invention to eliminate faulty signal parameters arising from influences due to temperature, aging or drift by maintaining the keying ratios of the digitized signals constant. It is a further object of the present invention to correct the signal parameters in a simple, dependable and non-disruptive manner.

One advantage of the present invention is that additional superposition errors caused by the frequency behavior of the electrical components in the regulation circuit cannot arise.

A further advantage achieved with the present invention is that the regulation system operates satisfactorily immediately after pauses in operation.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENT

Figure 1:
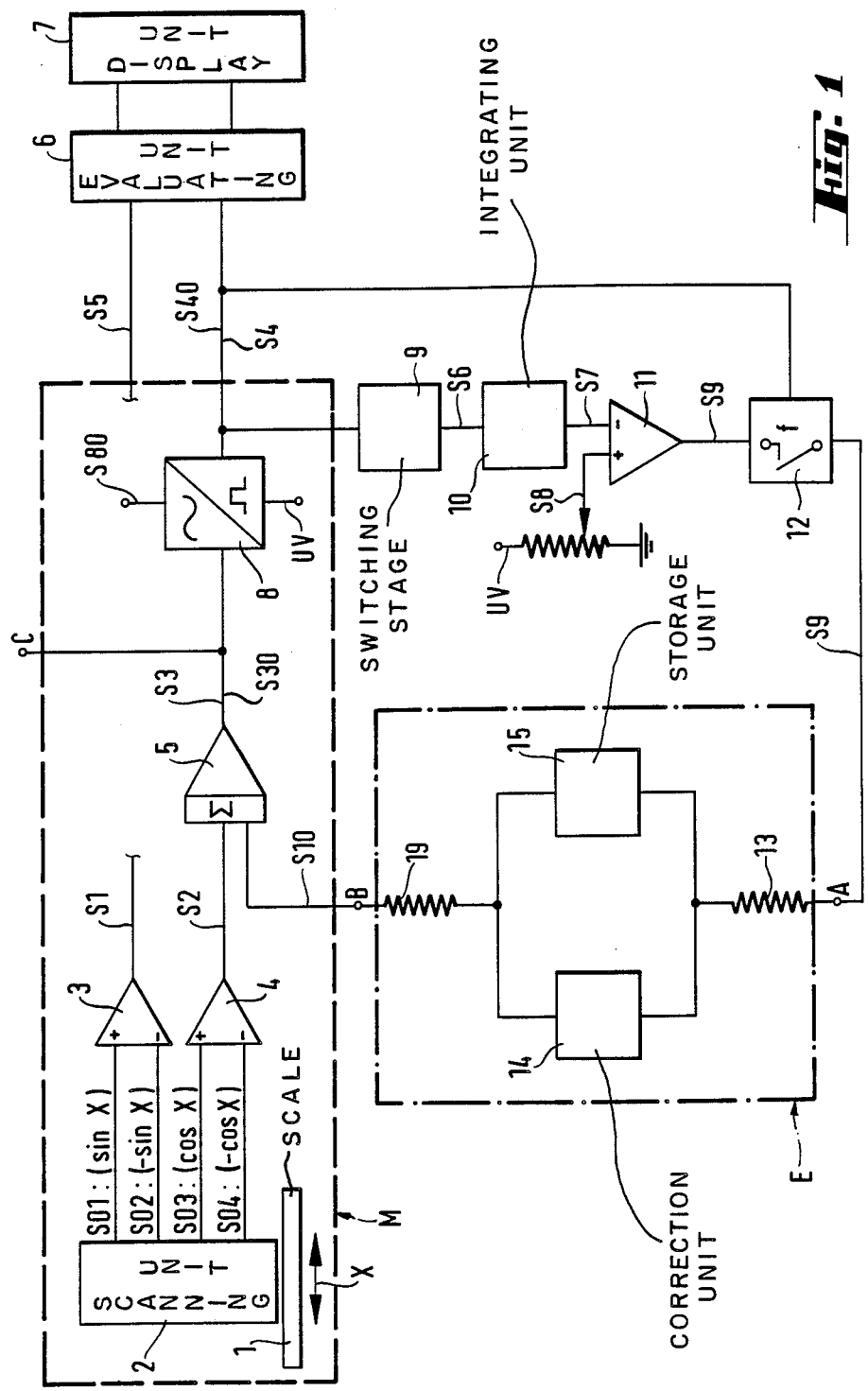
FIG. 1 is a schematic representation of the preferred embodiment of the present invention.

Turning now to the drawings, FIG. 1 shows a known incremental photo-electric length measuring system M. The system M may be used to measure the relative position of two objects, not shown, moveable with respect to one another, such as two machine components of a processing or measuring machine. The measuring system M produces two square signals S4, S5. The keying ratios of these two signals S4, S5 are corrected to a given value before the square signals S4, S5 are further processed. A grid scale 1, connected with the first object (not shown), moves in a measuring direction X relative to the scanning unit 2 which is connected to the second object (not shown). The scanning unit 2 comprises four scanning grids offset to one another by a quarter of the grid constant. A photo-element is allocated to each of the four scanning grids. The four scanning grids form two pairs of scanning grids offset to one another by half the grid constant. The scanning unit 2, in scanning the grid scale 1, produces four scanning signals S01, S02, S03, S04. The scanning signals S01, S02, S03, S04 are phase displaced with respect to one another by a quarter of the grid constant and represent, respectively: sin X, −sin X, cos X, −cos X. The first scanning signal S01 and the second scanning signal S02, which is phase displaced with respect to the first scanning signal S01 by half a grid constant, are fed to a first differential amplifier 3 to produce the first measuring signal S1. The first measuring signal S1 is representative of (sin x)−(−sin x). The third scanning signal S03 and the fourth scanning signal S04, which is phase displaced with respect to S03 by half the grid constant, are supplied to a second differential amplifier 4. The amplifier 4 produces the second measuring signal S2, representative of (cos x)−(−cos x). The two measuring signals S1, S2 are phase displaced with respect to one another by a quarter of the grid constant. In the ideal case, the measuring signals S1, S2 are symmetrical about their zero line due to the fact that the difference formation of the scanning signals S01, S02 and of the scanning signals S03, S04 in the differential amplifiers 3, 4 eliminates the direct current or the direct voltage components GA. However, in the formation of the difference, errors may arise if the photo-elements deviate from one another in their characteristics. Such deviation is generally encountered with commercial photo-elements. In addition, the characteristics of the photo-elements may change due to influences of temperature, aging and drift. Further, differences in the spacings between the individual photo-elements and the light sources, between the photo-elements and the scanning grids, or between the light sources and the grid scale 1 can lead to a direct current or direct voltage component GA of the two measuring signals S1, S2.

Since the correction of the first measuring signal S1 is identical to the correction of the second measuring signal S2, the correction of the first measuring signal S1 will not be discussed. The following discussion therefore relates only to the correction of the second measuring signal S2. The measuring signal S2 is amplified by an amplifier 5 and then transformed by a trigger 8 into a square signal S4. The trigger 8 is connected to an evaluating unit 6 comprising an interpolation arrangement, an up-down counter, and a display unit 7. The display unit 7 displays the position measuring values for the relative position of the two objects which are moveable with respect to one another. In order for the path or angle dependent evaluation and interpolation to be error free, the square signal S4 must present a constant keying ratio.

To regulate the keying ratio, the measuring signal S2 is fed, after amplification, to the trigger 8. The trigger 8 transforms the amplified measuring signal S3 into a square signal S4 with virtually constant signal levels SB, SU. The trigger threshold of the trigger 8 is maintained constant by control signal S80, preferably at the level of the zero line N of the amplified measuring signal S3. The upper signal level SB of the square signal S4 is dependent only on the trigger supply voltage UV. The square signal S4 is fed to a switching stage 9 wherein the signal levels SB, SU are stabilized so that a stabilized square signal S6 with constant signal levels SB, SU can be output.

The keying ratio is defined as the ratio of the impulse duration T1 to the period duration T, wherein $T = T1 + T2$ and T2 represents the duration of the absence of the impulse.

Figure 2:
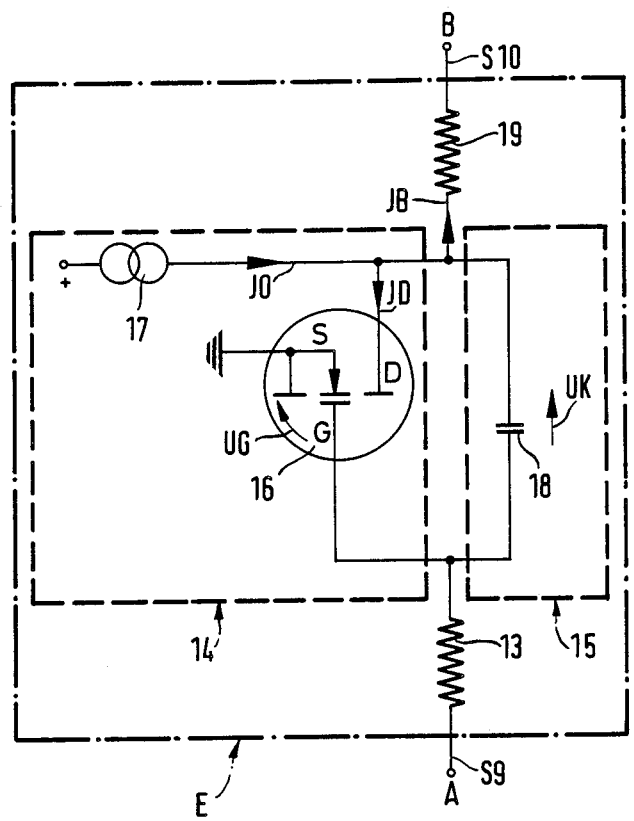
FIG. 2 is a schematic representation of a component of the preferred embodiment shown in FIG. 1.

To regulate the keying ratio to a given value, the stabilized square signal S6 is fed to an integrating unit 10. The integrating unit 10, when in the active state, converts the stabilized square signal S6 into a signal S7, proportional to the keying ratio. A regulating amplifier 11 compares the signal S7 with a constant desired signal S8 which corresponds to the demanded constant keying ratio. The regulating amplifier 11 produces a comparison dependent difference signal S9. In general, as shown in FIG. 1, the constant desired signal S8 is derived from the trigger supply voltage UV. The difference signal S9 is supplied to a frequency dependent switch 12. The switch 12 is operative to interrupt the analog regulating circuit when the frequency of the signals S4, S40 fall below the selectable signal frequency F. For signal S4, S40 frequencies above the frequency F, the difference signal S9 is passed to a circuit E. The circuit E comprises a pre-resistance 13, a correction unit 14 for the formation of a correction signal S10, a storage unit 15 connected parallel to the correction unit 14 and a resistance 19. The correction unit 14 is shown in FIG. 2 and comprises a MOS-FET 16 with a constant current source 17. The storage unit 15 comprises a capacitor 18. The pre-resistance 13 is preferably of high ohmic value and is connected to the gate G of the MOS-FET 16. The source S electrode of the MOS-FET 16 is connected to ground. The drain D electrode is connected to the second electrode of the capacitor 18, the resistance 19 and the constant current source 17.

The difference signal S9 is applied to the gate G of the MOS-FET 16 and to an electrode of the capacitor 18. This produces an increase in the gate voltage UG and capacitor voltage UK. A source current JO, dependent upon voltage UG, UK and therefore dependent on the difference signal S9, flows from the constant current source 17. A small part of the source current JO flows over the drain D as drain current JD to the source S. The other part of the source current JO passes as correction current JB over the resistance 19. The correction current JB is thereby transformed into a correction signal S10 and applied to the amplifier 5. The amplifier 5 is configured as a sum amplifier. The measuring signal S2, which is to be corrected, is applied to one input of the amplifier 5 and the correction signal S10, for the regulation of the keying ratio of the square signal S4, is applied to the other input of the amplifier 5. Both applied signals S2 and S10 are summed by means of the amplifier 5 and amplified. At the output of the amplifier 5, there is produced a corrected measuring signal S30, which, by means of trigger 8, is transformed into a corrected square signal S40 with a predetermined constant keying ratio.

When the frequency of the square signal S4, and therefore also the frequency of the measuring signal S2, falls below the lower selectable frequency F of the frequency dependent switch 12, the difference signal S9 is no longer passed to the correction unit 14 and the storage unit 15. In this case, the source current JO, the drain current JD and the correction current JB are controlled only by the stored charge on the capacitor 18.

This stored charge is proportional to the difference signal S9 which was produced by the differential amplifier 11 before the frequency of the signals S4, S40 fell below the threshold frequency F of the switch 12. At that time, the switch 12 was closed, allowing the difference signal S9 to pass over the pre-resistance 13 to an electrode of the capacitor 18. If a pause in the operation occurs, then, immediately after the resumption of operation of the measuring system M, the correction current JB is determined by the stored charge of the capacitor 18. This occurs even after relatively long pauses in operation. The parallel circuit comprising the correction unit 14 and the storage unit 15 acts as an integrating unit, so that only those correction signals S10 of a determinable duration are additively superposed on the measuring signal S2.

Figure 3:
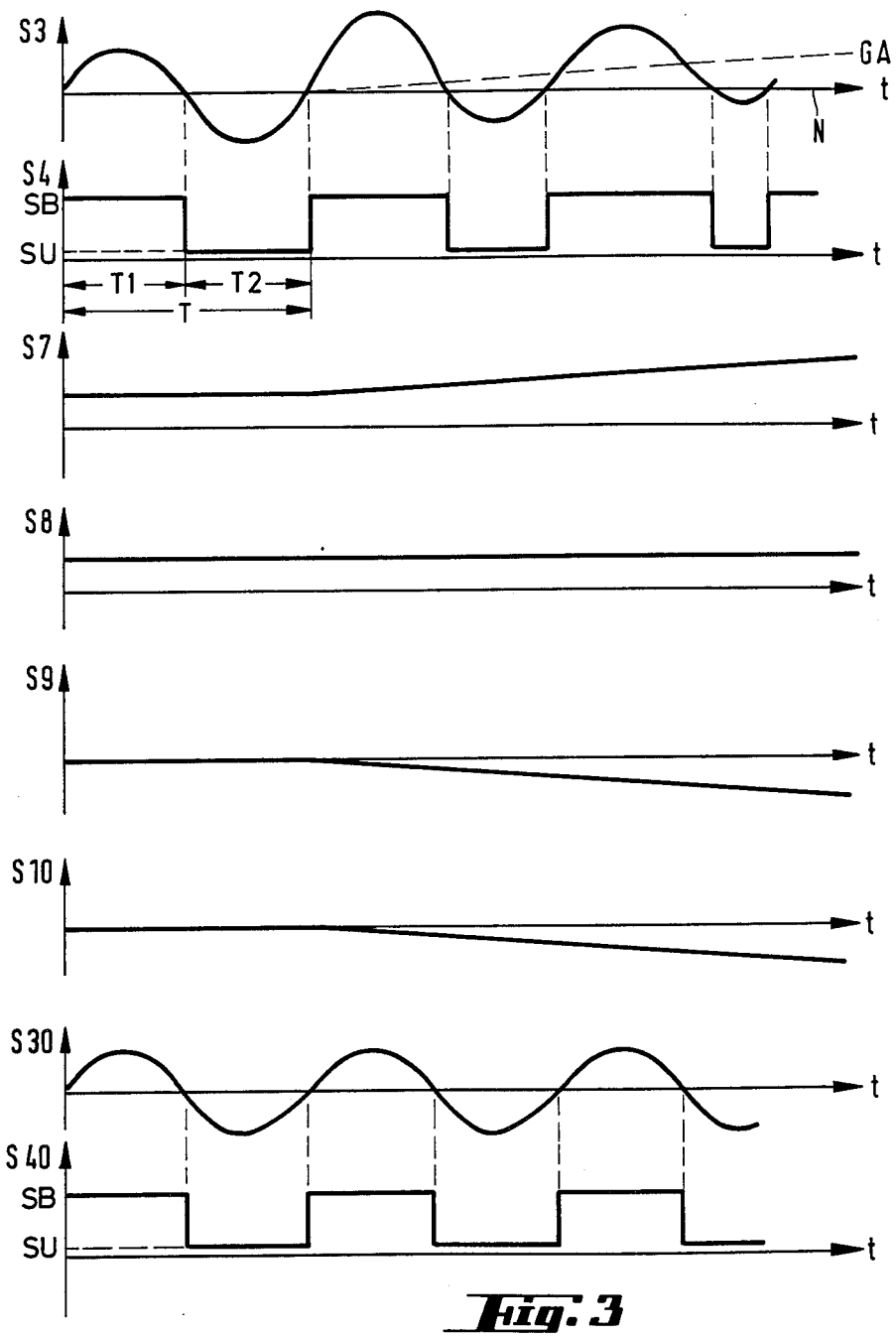
FIG. 3 is a time dependent representation of several of the electrical signals produced in the preferred embodiment shown in FIG. 1.

FIG. 3 shows a signal diagram of the signals produced by the various components of the circuit shown in FIG. 1.

The sinusoidal amplified measuring signal S3 is shown, for one period T, in an error free state without a direct current or direct voltage component GA. After the first period T there is superposed on the amplified measuring signal S3 a direct current or direct voltage component GA as might occur from drift. The square signal S4, obtained after the trigger 8, is independent of the amptitude of the amplified measuring signal S3. The upper signal level SB and the lower signal level SU are dependent only on the trigger supply voltage UV and the characteristics of the trigger 8. The trigger threshold is set by the control signal S80 on the zero line N.

The signal S7, proportional to the keying ratio of the square signal S4, is compared with the adjustable desired signal S8 which is proportional to the required constant keying ratio. The difference signal S9 is the result of this comparison. The correction signal S10 is proportional to the difference signal S9 and is added to the measuring signal S2 in the sum amplifier 5 to produce a corrected amplified measuring signal S30. The processing of the corrected amplified measuring signal S30 occurs in the same manner as that described for the amplified measuring signal S3, such that, after the trigger 8, a corrected square signal S40 is produced with the required constant keying ratio. It should be understood that the parallel circuit comprising the correction unit 14 and a storage unit 15 is assumed to be non-inverting.

There has been described only the regulation of the square signal S4 which was derived from the amplified measuring signal S3. However, it should be understood that it is also possible to derive a square signal, whose keying ratio can be regulated, directly from each scanning signal or from the non-amplified measuring signals.

The square signal S4 or the corrected signal S40 is supplied, in the example shown, to the evaluating unit 6 for further processing. In practice, the amplified scanning signal S3 or the corrected amplified scanning signal S30 is often connected to a terminal C located outside the measuring system M. This allows the signal to be tapped for further processing.

It is obvious that the scanning signals and the measuring signals may deviate from the sinusoidal form. Further, the constant-current source does not have to be executed as shown. It can also be in the form of a resistor.

Additionally, the frequency dependent switch 12 may consist of an arrangement that comprises a frequency direct voltage convertor and a relay. The frequency direct voltage convertor produces a direct voltage, the magnitude of which is proportional to the frequency of the measuring signal or of the triggered measuring signal. The contacts of the relay are then actuated in a manner dependent on this direct voltage.

Further, a capacitor circuited parallel to a MOS amplifier can serve as a storage unit. In this case, the signal proportional to the keying ratio will be supplied to the frequency dependent switch and would pass, when the switch is closed, to one input of the MOS amplifier. The MOS amplifier is connected to an electrode of the parallel circuited capacitor. The desired signal is applied to the second input of the MOS amplifier so that the output of the MOS amplifier, to which a second electrode of the capacitor is connected, produces the correction signal.

In regulating the keying ratio of the square signal, the trigger threshold of the trigger 8 can also be altered by superposing the correction signal on the control signal of the trigger 8.

The frequency dependent switch 12 is constructed in such a way that it closes the regulating circuit only when the signal S4, S40 is above a selectable frequency F. This switch may, however, also have the property (not shown) that it is closed only when the amplified measuring signal S4, S40 is within a pre-determined frequency range with a lower and upper adjustable frequency F.

It should be understood that the correction unit and the storage unit can also, by means of suitable components, be circuited in series.

It should be understood that a wide range of changes and modifications can be made to the preferred embodiment described above. For example, the invention is not restricted to photo-electric measuring systems, but can also be used with magnetic, inductive and capacitive measuring systems. It is, therefore, intended that the foregoing detailed description be regarded as illustrative rather than limiting, and that it be understood that it is the following claims, including all equivalents, which are intended to define the scope of this invention.

I claim:

1. In a process used in digital length or angle measuring systems for the regulation of the keying ratio of at least one periodic electrical signal to a selectable value, the process comprising comparing at least one signal which is proportional to the keying ratio of the periodic electrical signal with a selected value signal proportional to the selected value of the keying ratio; and producing a momentary difference signal dependent on the comparison, the improvement comprising:

producing a correction signal which is (1) dependent on the momentary difference signal when the frequency of the periodic electrical signal is within a selectable frequency range; and, (2) dependent on a value stored in a storage means when the frequency of the periodic electrical signal is outside the selectable frequency ranqe, the stored value being proportional to the last momentary difference signal when the frequency of the periodic electrical signal was within the selectable frequency range; and superposing the correction signal on the periodic electrical signal.

2. The process of claim 1 wherein the step of superposing the correction signal on the periodic electrical signal is accomplished only with a correction signal of duration above a selectable duration.

3. In a digital length or angle measuring system of the type comprising means for generating at least one periodic electrical signal, means for generating at least one signal proportional to the keying ratio of the periodic electrical signal, means for generating a selectable value signal proportional to the selectable value of the keying ratio, means for comparing the at least one signal proportional to the keying ratio with the selectable value signal, means for producing a momentary difference signal dependent on the comparison, and means for regulating the keying ratio of the at least one periodic electrical signal based on the difference signal, the improvement comprising:

means for producing a correction signal (1) when the frequency of the periodic electrical signal is within a selectable frequency range, the correction signal being dependent on the momentary difference signal; and (2) when the frequency of the periodic electrical signal is outside the selectable frequency range, the correction signal being dependent on a stored value; and means for superposing the correction signal on the periodic electrical signal.

4. The invention of claim 3 wherein the means for producing a correction signal comprises:

a storage circuit; and
a correction signal circuit electrically connected parallel to the storage circuit.

5. The invention of claim 4 wherein the correction signal circuit comprises:

a MOS-FET semiconductor element comprising a drain electrode; and
a constant current source electrically connected to the drain electrode of the MOS-FET semiconductor element.

6. The invention of claim 4 wherein the storage circuit comprises a capacitor.

7. In a digital length or angle measuring system of the type comprising means for generating at least one periodic electrical signal, means for generating at least one signal proportional to the keying ratio of the periodic electrical signal, means for generating a selectable value signal proportional to the selectable value of the desired keying ratio, means for comparing the at least one signal proportional to the keying ratio with the selectable value signal, means for generating a momentary difference signal dependent on the comparison and means for regulating the keying ratio of the periodic electrical signal based on the difference signal, the improvement comprising:

a storage circuit;
a correction circuit connected parallel to the storage circuit;
means for selectively applying the momentary difference signal to the storage and correction circuits only when the frequency of the periodic electrical signal lies within a selectable frequency range;
the storage circuit and correction circuit operative to supply to the regulating means a correction signal proportional to the most recently stored momentary difference signal of a selectable duration.

8. The invention of claim 7 wherein the correction circuit comprises an amplifier and the storage circuit comprises a capacitor and wherein the amplifier and the capacitor are operative to integrate the difference signal.

9. The invention of claim 3 wherein the stored value is derived from a previously determined momentary difference signal when the frequency of the periodic electrical signal was within a selectable frequency range.

* * * * *